(12) United States Patent
Aoyagi

(10) Patent No.: US 6,922,129 B2
(45) Date of Patent: Jul. 26, 2005

(54) HIGH-WORK-EFFICIENCY MULTILAYERED CIRCUIT BOARD

(75) Inventor: Toru Aoyagi, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 99 days.

(21) Appl. No.: 10/689,457

(22) Filed: Oct. 20, 2003

(65) Prior Publication Data

US 2004/0080922 A1 Apr. 29, 2004

(30) Foreign Application Priority Data

Oct. 22, 2002 (JP) .................................. 2002-006674 U

(51) Int. Cl.⁷ ................................................ H01F 5/00
(52) U.S. Cl. ...................... 336/200; 336/223; 336/232
(58) Field of Search ................................ 336/200, 223, 336/232; 29/602.1

(56) References Cited

U.S. PATENT DOCUMENTS 6,403,199 B2 * 6/2002 Mori et al. ................. 428/209
6,472,074 B2 * 10/2002 Sugimoto ................... 428/432
2002/0030573 A1 * 3/2002 Mori et al. .................... 336/73
2002/0037804 A1 * 3/2002 Sugimoto et al. ........... 501/139
2004/0029701 A1 * 2/2004 Chikagawa et al. .......... 501/32

FOREIGN PATENT DOCUMENTS

JP          11-103229        4/1999

* cited by examiner

Primary Examiner—Anh Mai
(74) Attorney, Agent, or Firm—Brinks Hofer Gilson & Lione

(57) ABSTRACT

A multilayered circuit board according to the present invention includes at least first and second stacked insulating layers. The first insulating layer has thereon a first electric conductor made of a conductive film constituting an inductor and a first electrode made of a conductive film constituting a capacitor. The second insulating layer has thereon a second electrode made of a conductive film constituting a capacitor. The first and second insulating layers are stacked such that the first and second electrodes are opposed to each other through the insulating layers. Therefore this provides a circuit board having a capacitor and an inductor through the use of the two insulating layers, thus providing an inexpensive thin circuit board with small parts count and high work-efficiency compared with the use of three insulating layers in a related art.

8 Claims, 7 Drawing Sheets

HIGH-WORK-EFFICIENCY MULTILAYERED CIRCUIT BOARD

BACKGROUND OF THE INVENTION

1. Field of the Invention

The present invention relates to a multilayered circuit board suitable for use in an electric circuit of a band-pass filter or the like.

2. Description of the Related Art

Known multilayered circuit boards will be described. FIG. 8 is an exploded perspective view of a known multilayered circuit board in which an inductor and a capacitor are connected in parallel; FIG. 9 is a circuit diagram of the multilayered circuit board of FIG. 8; FIG. 10 is an exploded perspective view of a known multilayered circuit board in which an inductor and a capacitor are connected in series; and FIG. 11 is a circuit diagram of the multilayered circuit board of FIG. 10.

Referring to FIG. 8, the arrangement of the multilayered circuit board in which an inductor and a capacitor are connected in parallel will be described. First, second, and third ceramic insulating layers 51, 52, and 53 are stacked on top of each other in layers.

The first insulating layer 51 has a first rectangular electrode 54 formed of a conductive film of silver or the like on the surface. The first electrode 54 has a first extension 55.

The second insulating layer 52 has a first U-shaped electric conductor 56 formed of a conductive film of silver or the like on the surface. The first electric conductor 56 has a hole 56a at a first end and the first electrode 54 has a hole 54a, which have a connector such as a through hole (not shown) to electrically connect the first end of the first electric conductor 56 and the first electrode 54.

The third insulating layer 53 has a second rectangular electrode 57 formed of a conductive film of silver or the like on the surface. The second electrode 57 has a second extension 58.

The first electric conductor 56 has a hole 56b at a second end and the second electrode 57 has a hole 57a, which have a connector such as a through hole (not shown) to electrically connect the second end of the first electric conductor 56 and the second electrode 57.

The multilayered circuit board with such an arrangement has a capacitor C formed of the first and second electrodes 54 and 57 opposed to each other through the first and second insulating layers 51 and 52, and an inductor L formed of the first electric conductor 56.

Accordingly, as FIG. 9 shows, the inductor L and the capacitor C are connected in parallel between the first and second extensions 55 and 58.

Referring now to FIG. 10, the arrangement of the multilayered circuit board in which an inductor and a capacitor are connected in series will be described. First, second, and third ceramic insulating layers 61, 62, and 63 are stacked on top of each other in layers.

The first insulating layer 61 has a first U-shaped electric conductor 64 formed of a conductive film of silver or the like on the surface. The first electric conductor 64 has a first extension 65 at a first end.

The second insulating layer 62 has a first rectangular electrode 66 formed of a conductive film of silver or the like on the surface. The first electrode 66 has a hole 66a and the first electric conductor 64 has a hole 64a at a second end, which have a connector such as a through hole (not shown) to electrically connect the second end of the first electric conductor 64 and the first electrode 66.

The third insulating layer 63 has a second rectangular electrode 67 formed of a conductive film of silver or the like on the surface. The second electrode 67 has a second extension 68.

The multilayered circuit board with such an arrangement has a capacitor C formed of the first and second electrodes 66 and 67 opposed to each other through the second insulating layer 62 and an inductor L formed of the first electric conductor 64.

Accordingly, as FIG. 11 shows, the inductor L and the capacitor C are connected in series between the first and second extensions 65 and 68.

The known multilayered circuit boards including the inductor and the capacitor require at least three insulating layers, thus disadvantageously including a large number of components to increase the cost and the thickness.

The use of three insulating layers poses the problems of requiring much time and labor for production and needing through-hole conduction work in at least one part, thus decreasing production efficiency.

SUMMARY OF THE INVENTION

Accordingly, it is an object of the present invention to provide an inexpensive thin multilayered circuit board with low parts count and high work efficiency.

In order to solve the above problems, a multilayered circuit board is provided as a first solving means which includes at least first and second stacked insulating layers. The first insulating layer has thereon a first electric conductor made of a conductive film constituting an inductor and a first electrode made of a conductive film constituting a capacitor. The second insulating layer has thereon a second electrode made of a conductive film constituting a capacitor. The first and second insulating layers are stacked such that the first and second electrodes are opposed to each other through the insulating layers.

As a second solving means, the first electric conductor is arranged along the outer periphery of the first insulating layer; and the first electrode is arranged inside the first electric conductor and in the center of the first insulating layer.

As a third solving means, the first electric conductor and the first electrode are connected to each other with a first connecting conductor made of a conductive film.

As a fourth solving means, the first electric conductor has a first extension and the second electrode has a second extension. The inductor and the capacitor are connected in series between the first and second extensions.

As a fifth solving means, the second insulating layer includes a second electric conductor formed of a conductive film constituting an inductor along the outer periphery and the second electrode formed inside the second electric conductor and in the center of the second insulating layer. The second electric conductor has a first extension and the second electrode has a second extension. The inductor and the capacitor are connected in series between the first and second extensions.

As a sixth solving means, the multilayered circuit board further includes at least one third insulating layer stacked on the first and second insulating layers. The third insulating layer has a third electric conductor formed of a conductive film constituting an inductor. The second insulating layer includes a second electric conductor formed of a conductive film constituting an inductor along the outer periphery and the second electrode arranged inside the second electric conductor and in the center of the second insulating layer. The first electric conductor has a first extension and the first electrode has a second extension. The inductor and the capacitor are connected in series between the first and second extensions.

As a seventh solving means, the second insulating layer includes a second electric conductor formed of a conductive film constituting an inductor along the outer periphery and the second electrode arranged inside the second electric conductor and in the center of the second insulating layer. The second electric conductor and the second electrode are connected to each other with a second connecting conductor formed of a conductive film. The first connecting conductor has a first extension and the second connecting conductor has a second extension. The inductor and the capacitor are connected in parallel between the first and second extensions.

As an eighth solving means, the multilayered circuit board further includes at least one third insulating layer stacked on the first and second insulating layers. The third insulating layer has a third electric conductor formed of a conductive film constituting an inductor. The second insulating layer includes a second electric conductor formed of a conductive film constituting an inductor along the outer periphery and the second electrode arranged inside the second electric conductor and in the center of the second insulating layer. The second electric conductor and the second electrode are connected to each other with a second connecting conductor formed of a conductive film. The first connecting conductor has a first extension and the third electric conductor has a second extension. The inductor and the capacitor are connected in parallel between the first and second extensions.

DESCRIPTION OF THE PREFERRED EMBODIMENTS

A multilayered circuit board according to embodiments of the present invention will be described hereinafter with reference to the drawings.

Figure 1:
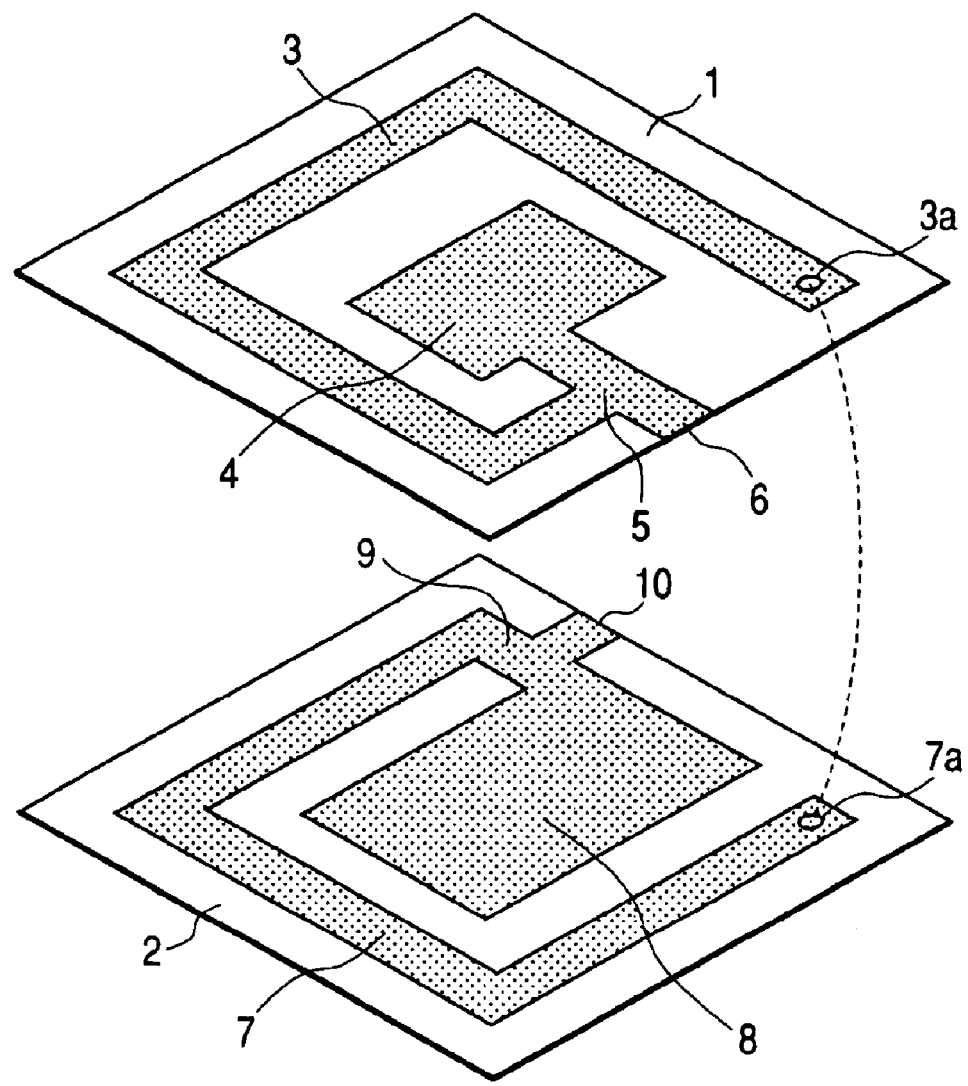
FIG. 1 is an exploded perspective view of a multilayered circuit board according to a first embodiment of the present invention, in which an inductor and a capacitor are connected in parallel.

Referring first to FIG. 1, the arrangement of a multilayered circuit board according to a first embodiment will be described in which an inductor and a capacitor are connected in parallel. First and second insulating layers 1 and 2 made of ceramic such as low-temperature co-fired ceramic (LTCC) are stacked in order to form a multilayered ceramic substrate (low-temperature co-fired ceramic substrate).

The first insulating layer 1 has on its surface a first U-shaped electric conductor 3 formed of a conductive film of silver or the like and provided along the outer periphery of the first insulating layer 1, a first rectangular electrode 4 provided inside the first electric conductor 3 and in the center of the first insulating layer 1, a first connecting conductor 5 that connects the first electric conductor 3 and the first electrode 4, and a first extension 6 provided to the first connecting conductor 5.

The second insulating layer 2 has on its surface a second U-shaped electric conductor 7 formed of a conductive film of silver or the like and provided along the outer periphery of the second insulating layer 2, a second rectangular electrode 8 provided inside the second electric conductor 7 and in the center of the second insulating layer 2, a second connecting conductor 9 formed of a conductive film of silver or the like and connecting the second electric conductor 7 and the second electrode 8, and a second extension 10 provided to the second connecting conductor 9.

The first electric conductor 3 has a hole 3a at the end and the second electric conductor 7 has a hole 7a, which have a connector such as a through hole (not shown) to electrically connect the first and second electric conductors 3 and 7.

The multilayered circuit board with such an arrangement has a capacitor C formed of the first and second electrodes 4 and 8 opposed to each other through the first insulating layer 1 and an inductor L formed of the first and second electric conductors 3 and 7.

Figure 3:
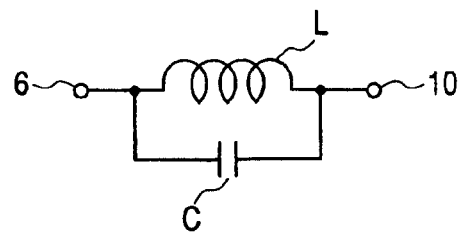
FIG. 3 is a circuit diagram of the multilayered circuit board of FIGS. 1 and 2.

Accordingly, as FIG. 3 shows, the inductor L and the capacitor C are connected in parallel between the first and second extensions 6 and 10.

The method for making the multilayered circuit board is not shown here; it is made in such a way that conductive paste of silver or the like is printed on a green sheet made of low-temperature co-fired ceramic or the like, a plurality of which are stacked in layers and sintered.

Figure 2:
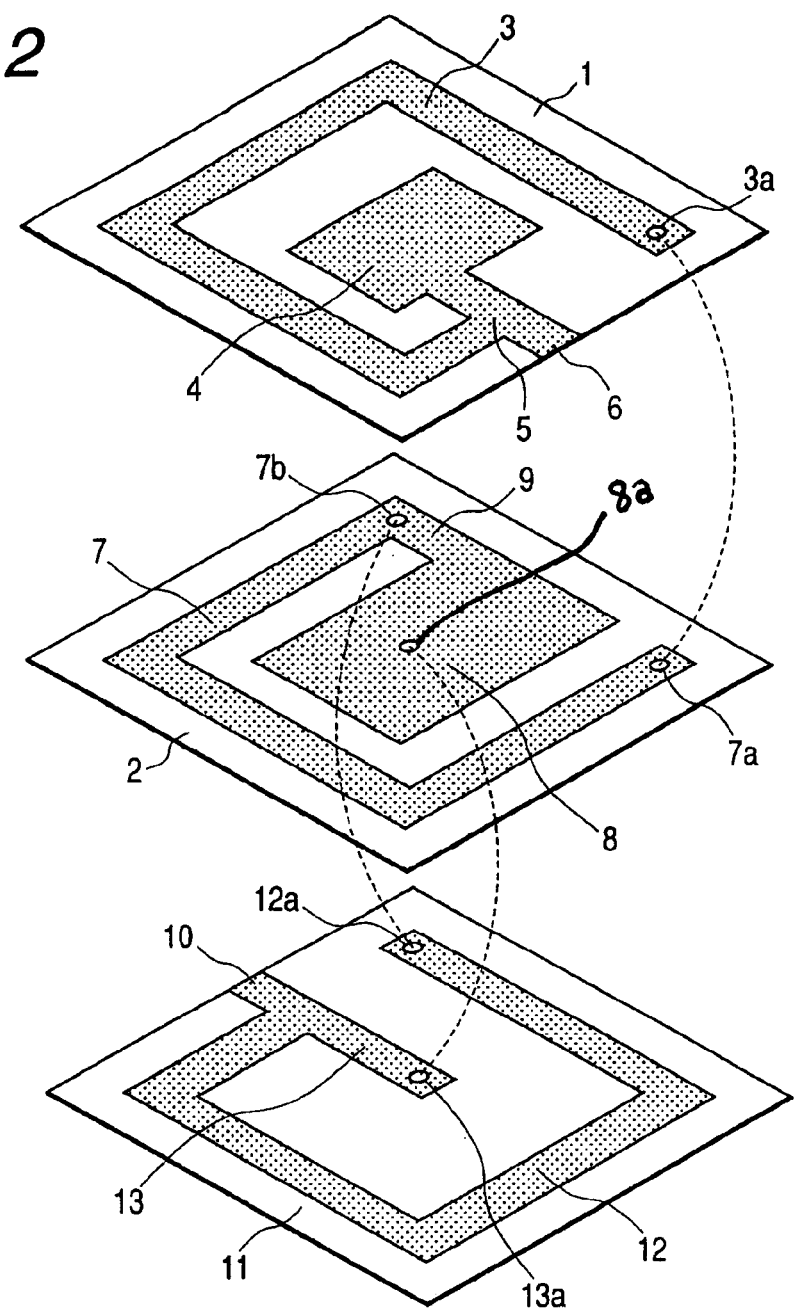
FIG. 2 is an exploded perspective view of a multilayered circuit board according to a second embodiment of the present invention, in which an inductor and a capacitor are connected in parallel.

Referring next to FIG. 2, the arrangement of a multilayered circuit board according to a second embodiment will be described in which an inductor and a capacitor are connected in parallel. First, second, and third insulating layers 1, 2, and 11 made of ceramic such as LTCC are stacked in layers to form a multilayered ceramic substrate (low-temperature co-fired ceramic substrate).

The first insulating layer 1 has on its surface the first U-shaped electric conductor 3 formed of a conductive film of silver or the like and provided along the outer periphery of the first insulating layer 1, the first rectangular electrode 4 provided inside the first electric conductor 3 and in the center of the first insulating layer 1, the first connecting conductor 5 that is made of a conductive film of silver or the like and connects the first electric conductor 3 and the first electrode 4, and the first extension 6 provided to the first connecting conductor 5.

The second insulating layer 2 has on its surface the second U-shaped electric conductor 7 formed of a conductive film of silver or the like and provided along the outer periphery of the second insulating layer 2, the second rectangular electrode 8 provided inside the second electric conductor 7 and in the center of the second insulating layer 2, and the second connecting conductor 9 formed of a conductive film of silver or the like and connecting the second electric conductor 7 and the second electrode 8.

The hole 3a at the end of the first electric conductor 3 and the hole 7a in the second electric conductor 7 have a connector such as a through hole (not shown) to electrically connect the first and second electric conductor 3 and 7.

The third insulating layer 11 has on its surface a third substantially U-shaped electric conductor 12 formed of a conductive film of silver or the like and provided along the outer periphery of the third insulating layer 11, a third connecting conductor 13 connected to the end of the third electric conductor 12, and the second extension 10 formed of a conductive film of silver or the like and provided to the third connecting conductor 13.

The second electric conductor 7 has a hole 7b at the end and the third electric conductor 12 has a hole 12a, which have a connector such as a through hole (not shown) to electrically connect the second and third electric conductors 7 and 12. The second electrode 8 has a hole 8a and the third connecting conductor 13 has a hole 13a, which have a connector such as a through hole (not shown) to electrically connect the second electrode 8 and the third connecting conductor 13.

The multilayered circuit board with such an arrangement has a capacitor C formed of the first and second electrodes 4 and 8 opposed to each other through the first insulating layer 1 and an inductor L formed of the first, second, and third electric conductors 3, 7, and 12.

Accordingly, as FIG. 3 shows, the inductor L and the capacitor C are connected in parallel between the first and second extensions 6 and 10.

The second embodiment includes one third insulating layer 11 having the third electric conductor 12. However, a plurality of insulating layers having an electric conductor may be provided to increase the inductor L.

Also by the method for making the multilayered circuit board according to the second embodiment (not shown here), it is made in such a way that conductive paste of silver or the like is printed on a green sheet made of low-temperature co-fired ceramic or the like, a plurality of which are stacked in layers and sintered.

Figure 4:
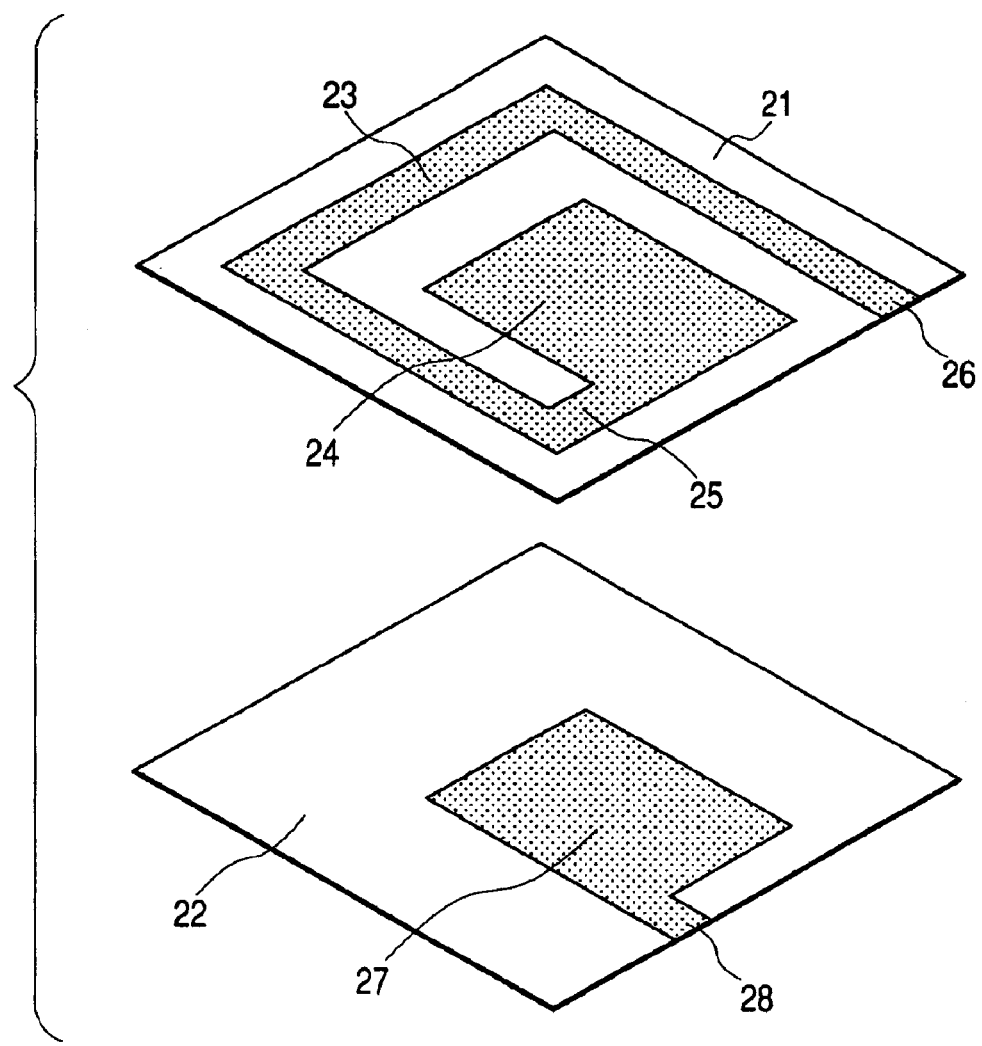
FIG. 4 is an exploded perspective view of a multilayered circuit board according to a third embodiment of the present invention, in which an inductor and a capacitor are connected in series.

Referring now to FIG. 4, the arrangement of a multilayered circuit board according to a third embodiment will be described in which an inductor and a capacitor are connected in series. First and second insulating layers 21 and 22 made of ceramic such as LTCC are stacked in order to form a multilayered ceramic substrate (low-temperature co-fired ceramic substrate).

The first insulating layer 21 has on its surface a first U-shaped electric conductor 23 formed of a conductive film of silver or the like and provided along the outer periphery of the first insulating layer 21, a first rectangular electrode 24 provided inside the first electric conductor 23 and in the center of the first insulating layer 21, a first connecting conductor 25 formed of a conductive film of silver or the like and connecting the first electric conductor 23 and the first electrode 24, and a first extension 26 provided at the end of the first electric conductor 23.

The second insulating layer 22 has on its surface a second rectangular electrode 27 formed of a conductive film of silver or the like and provided in the center of the second insulating layer 22, and a second extension 28 formed of a conductive film of silver or the like and connected to the second electrode 27.

The multilayered circuit board with such an arrangement has a capacitor C formed of the first and second electrodes 24 and 27 opposed to each other through the first insulating layer 21 and an inductor L formed of the first electric conductor 23.

Figure 7:
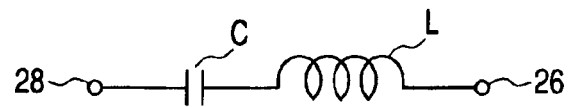
FIG. 7 is a circuit diagram of the multilayered circuit board of FIGS. 4 to 6.
Figure 8:
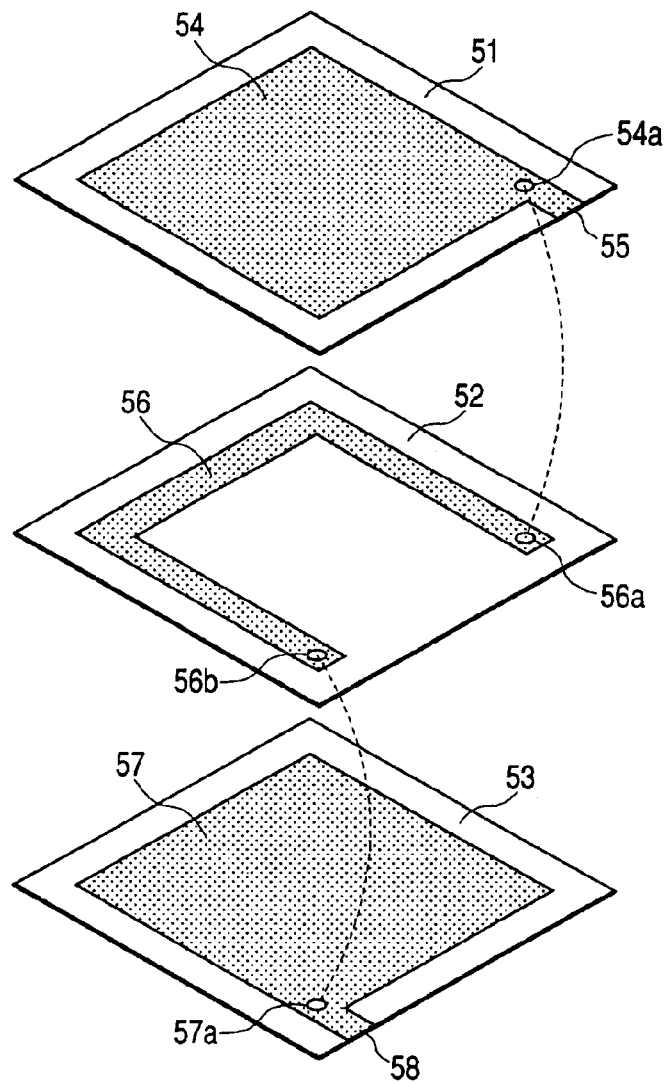
FIG. 8 is an exploded perspective view of a known multilayered circuit board, in which an inductor and a capacitor are connected in parallel.
Figure 9:
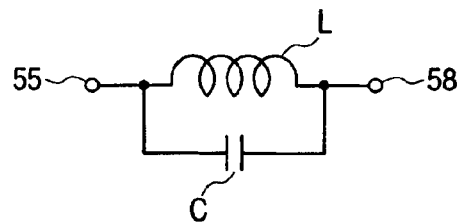
FIG. 9 is a circuit diagram of the multilayered circuit board of FIG. 8.
Figure 10:
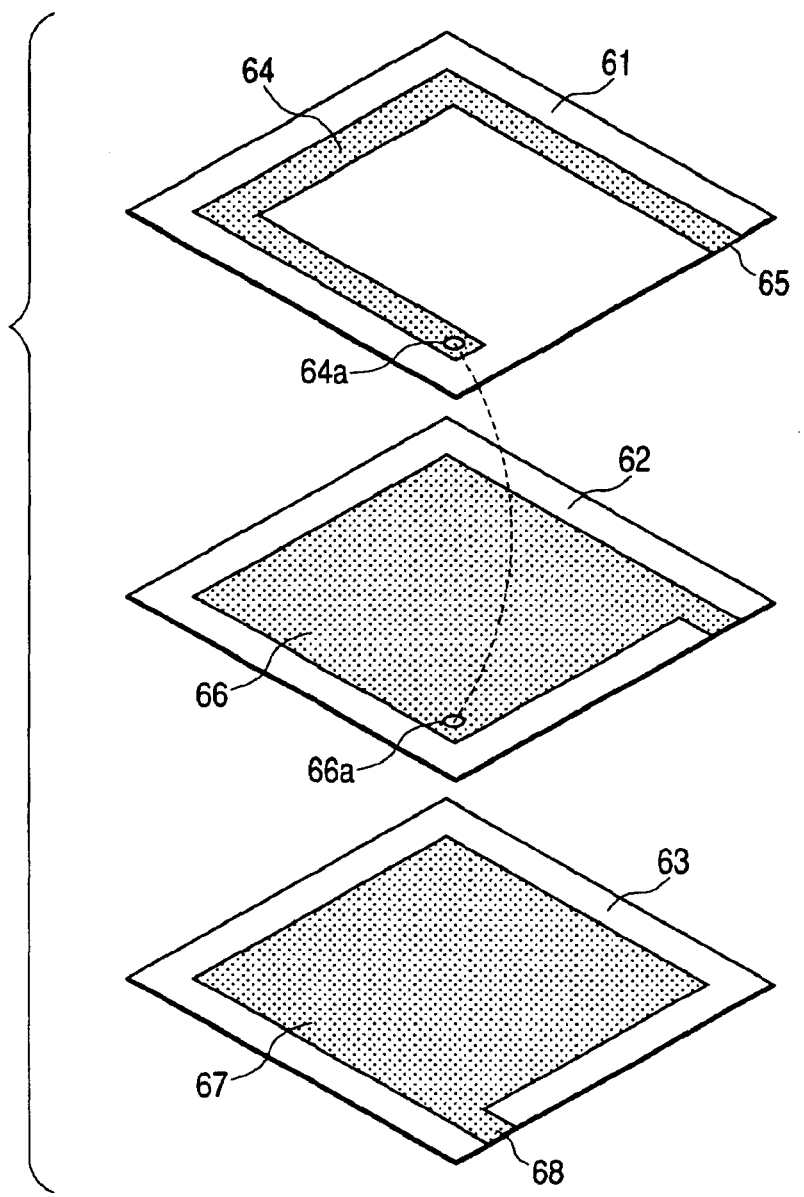
FIG. 10 is an exploded perspective view of a known multilayered circuit board, in which an inductor and a capacitor are connected in series.
Figure 11:
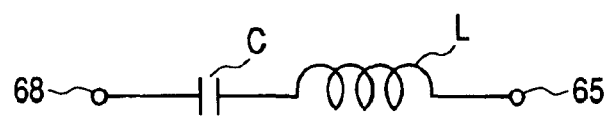
FIG. 11 is a circuit diagram of the multilayered circuit board of FIG. 10.

Accordingly, as FIG. 7 shows, the inductor L and the capacitor C are connected in series between the first and second extensions 26 and 28.

The method for making the multilayered circuit board according to the third embodiment is not shown here; it is made in such a way that conductive paste of silver or the like is printed on a green sheet made of low-temperature co-fired ceramic or the like, a plurality of which are stacked in layers and sintered.

Figure 5:
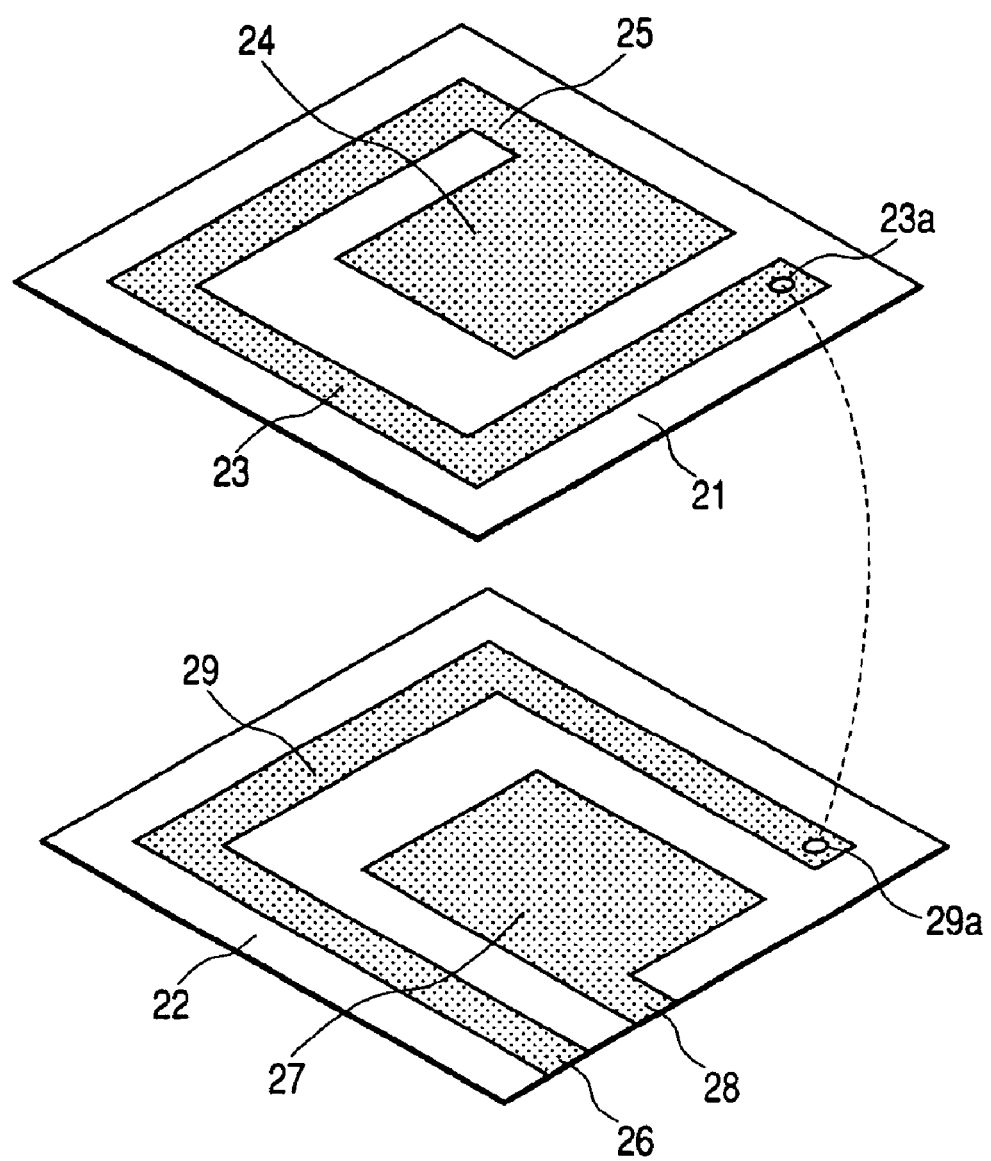
FIG. 5 is an exploded perspective view of a multilayered circuit board according to a fourth embodiment of the present invention, in which an inductor and a capacitor are connected in series.

Referring to FIG. 5, the arrangement of a multilayered circuit board according to a fourth embodiment will be described in which an inductor and a capacitor are connected in series. The first and second insulating layers 21 and 22 made of ceramic such as LTCC are stacked in order to form a multilayered ceramic substrate (low-temperature co-fired ceramic substrate).

The first insulating layer 21 has thereon the first U-shaped electric conductor 23 formed of a conductive film of silver or the like and provided along the outer periphery of the first insulating layer 21, the first rectangular electrode 24 provided inside the first electric conductor 23 and in the center of the first insulating layer 21, the first connecting conductor 25 formed of a conductive film of silver or the like and connecting the first electric conductor 23 and the first electrode 24, and the first extension 26 provided at the end of the first electric conductor 23.

The second insulating layer 22 has thereon a second U-shaped electric conductor 29 formed of a conductive film of silver or the like and provided along the outer periphery of the second insulating layer 22, the second rectangular electrode 27 provided inside the second electric conductor 29 and in the center of the second insulating layer 22, the first extension 26 provided at a second end of the second electric conductor 29, and the second extension 28 connected to the second electrode 27.

The first electric conductor 23 has a hole 23a at the end and the second electric conductor 29 has a hole 29a at a first end thereof, which have a connector such as a through hole (not shown) to electrically connect the first and second electric conductors 23 and 29.

The multilayered circuit board with such an arrangement has a capacitor C formed of the first and second electrodes 24 and 27 opposed to each other through the first insulating layer 21 and an inductor L formed of the first and second electric conductors 23 and 29.

Accordingly, as FIG. 7 shows, the inductor L and the capacitor C are connected in series between the first and second extensions 26 and 28.

Also by the method for making the multilayered circuit board according to the fourth embodiment (not shown here), it is made in such a way that conductive paste of silver or the like is printed on a green sheet made of low-temperature co-fired ceramic or the like, a plurality of which are stacked in order and sintered.

Figure 6:
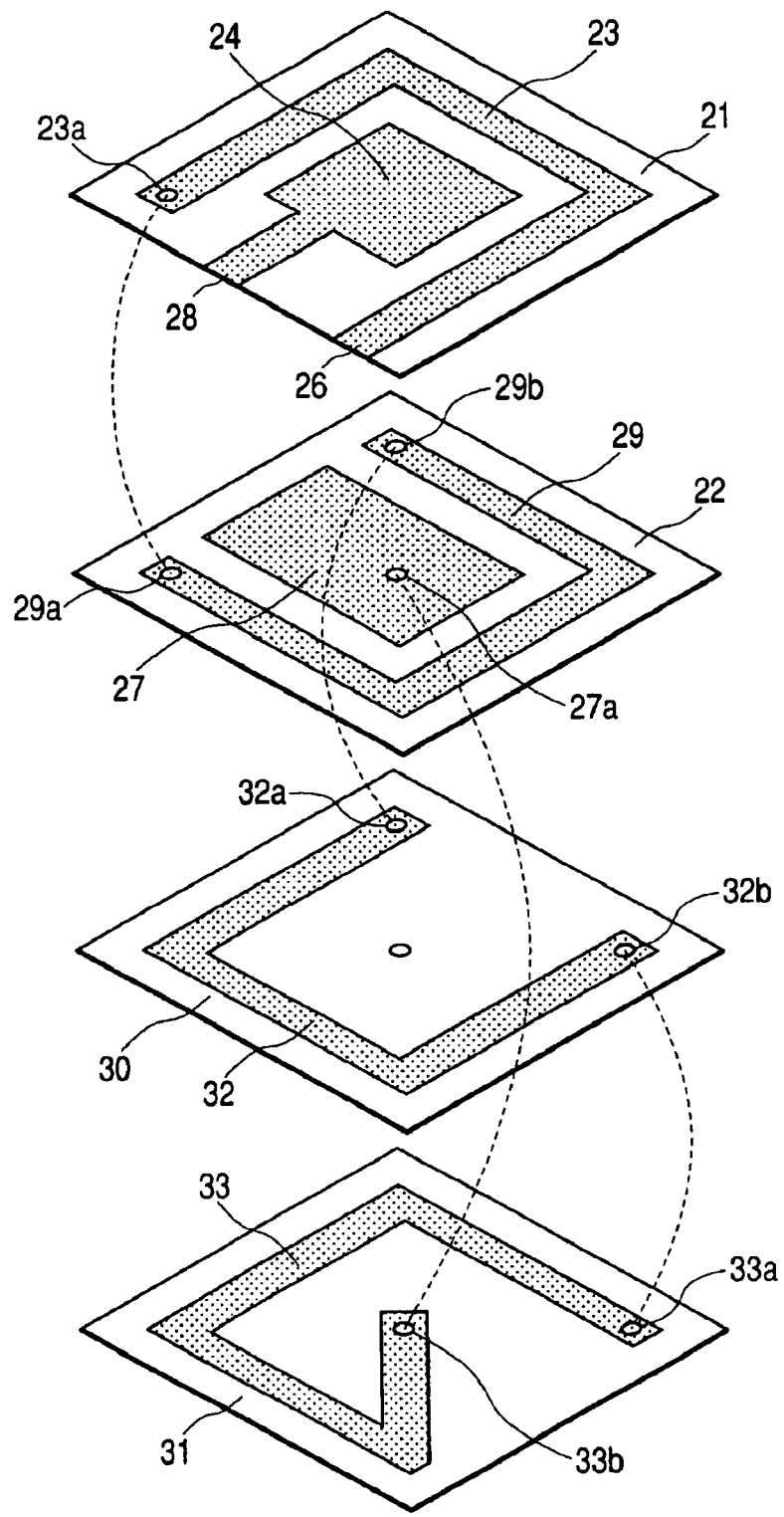
FIG. 6 an exploded perspective view of a multilayered circuit board according to a fifth embodiment of the present invention, in which an inductor and a capacitor are connected in series.

Referring to FIG. 6, the arrangement of a multilayered circuit board according to a fifth embodiment will be described in which an inductor and a capacitor are connected in series. The first and second insulating layers 21 and 22 and third and fourth insulating layers 30 and 31 made of ceramic such as LTCC are stacked in order to form a multilayered ceramic substrate (low-temperature co-fired ceramic substrate).

The first insulating layer 21 has thereon the first U-shaped electric conductor 23 formed of a conductive film of silver or the like and provided along the outer periphery of the first insulating layer 21, the first rectangular electrode 24 provided inside the first electric conductor 23 and in the center of the first insulating layer 21, the first extension 26 provided at the second end of the first electric conductor 23, and the second extension 28 connected to the first electrode 24.

The second insulating layer 22 has thereon the second U-shaped electric conductor 29 formed of a conductive film of silver or the like and provided along the outer periphery of the second insulating layer 22, and the second rectangular electrode 27 provided inside the second electric conductor 29 and in the center of the second insulating layer 22.

The hole 23a provided at the first end of the first electric conductor 23 and the hole 29a provided at a first end of the second electric conductor 29 have a connector such as a through hole (not shown) to electrically connect the first and second electric conductors 23 and 29.

The third insulating layer 30 has thereon a third U-shaped electric conductor 32 formed of a conductive film of silver or the like and provided along the outer periphery of the third insulating layer 30. The second electric conductor 29 has a hole 29b at a second end thereof and the third electric conductor 32 has a hole 32a at a first end thereof, which have a connector such as a through hole (not shown) to electrically connect the second and third electric conductors 29 and 32.

The fourth insulating layer 31 has thereon a fourth substantially U-shaped electric conductor 33 formed of a conductive film of silver or the like and provided along the outer periphery of the fourth insulating layer 31. The third electric conductor 32 has a hole 32b at a second end thereof and the fourth electric conductor 33 has a hole 33a at a first end thereof, which have a connector such as a through hole (not shown) to electrically connect the third and fourth electric conductors 32 and 33. The second electrode 27 has a hole 27a and the fourth electric conductor 33 has a hole 33b at a second end thereof, which have a connector such as a through hole (not shown) to electrically connect the second electrode 27 and the fourth electric conductor 33.

The multilayered circuit board with such an arrangement has a capacitor C formed of the first and second electrodes 24 and 27 opposed to each other through the first insulating layer 21 and an inductor L formed of the first, second, third, and fourth electric conductors 23, 29, 32, and 33.

Accordingly, as FIG. 7 shows, the inductor L and the capacitor C are connected in series between the first and second extensions 26 and 28.

Also by the method for making the multilayered circuit board according to the fifth embodiment (not shown here), it is made in such a way that conductive paste of silver or the like is printed on a green sheet made of low-temperature co-fired ceramic or the like, a plurality of which are stacked in order and sintered.

The multilayered circuit board according to the present invention includes at least first and second insulating layers. The first insulating layer has thereon a first electric conductor made of a conductive film constituting an inductor and a first electrode made of a conductive film constituting a capacitor. The second insulating layer has thereon a second electrode made of a conductive film constituting a capacitor. The first and second insulating layers are stacked such that the first and second electrodes are opposed to each other through the insulating layers.

Such an arrangement provides a circuit board having a capacitor and an inductor by the use of the two insulating layers, thus providing an inexpensive thin multilayered circuit board with small parts count and high work efficiency compared with the use of three insulating layers in a related art.

The first electric conductor is formed along the outer periphery of the first insulating layer; and the first electrode is formed inside the first electric conductor and in the center of the first insulating layer. Thus a compact circuit board with simple wiring can be provided.

The first electric conductor and the first electrode are connected to each other with a first connecting conductor made of a conductive film. Therefore, through-hole connection between the first electric conductor and the first electrode can be omitted and production efficiency is increased.

The first electric conductor has a first extension and the second electrode has a second extension; and the inductor and the capacitor are connected in series between the first and second extensions. Therefore, an inexpensive thin series-connected multilayered circuit board with small parts count can be provided.

The second insulating layer includes: a second electric conductor provided along the outer periphery, the second electric conductor being formed of a conductive film constituting an inductor; and the second electrode formed inside the second electric conductor and in the center of the second insulating layer. The second electric conductor has a first extension and the second electrode has a second extension. The inductor and the capacitor are connected in series between the first and second extensions. Therefore, a series-connected multilayered circuit board with high inductance can be provided.

The multilayered circuit board further includes at least one third insulating layer stacked on the first and second insulating layers. The third insulating layer has a third electric conductor formed of a conductive film constituting an inductor. The second insulating layer includes: a second electric conductor provided along the outer periphery, the second electric conductor being formed of a conductive film constituting an inductor; and the second electrode formed inside the second electric conductor and in the center of the second insulating layer. The first electric conductor has a first extension and the first electrode has a second extension. The inductor and the capacitor are connected in series between the first and second extensions. Therefore a series-connected multilayered circuit board with high inductance can be provided.

The second insulating layer includes: a second electric conductor provided along the outer periphery, the second electric conductor being formed of a conductive film constituting an inductor; and the second electrode formed inside the second electric conductor and in the center of the second insulating layer. The second electric conductor and the second electrode are connected to each other with a second connecting conductor formed of a conductive film. The first connecting conductor has a first extension and the second connecting conductor has a second extension. The inductor and the capacitor are connected in parallel between the first and second extensions. Therefore, an inexpensive thin parallel-connected multilayered circuit board with small parts count can be provided.

The multilayered circuit board further includes at least one third insulating layer stacked on the first and second insulating layers. The third insulating layer has a third electric conductor formed of a conductive film constituting an inductor. The second insulating layer includes: a second electric conductor provided along the outer periphery, the second electric conductor being formed of a conductive film constituting an inductor; and the second electrode formed inside the second electric conductor and in the center of the second insulating layer. The second electric conductor and the second electrode are connected to each other with a second connecting conductor formed of a conductive film. The first connecting conductor has a first extension and the third electric conductor has a second extension. The inductor and the capacitor are connected in parallel between the first and second extensions. Therefore, a parallel-connected multilayered circuit board with still higher inductance can be provided.

What is claimed is:

1. A multilayered circuit board, comprising:
    at least first and second stacked insulating layers, wherein
    the first insulating layer has thereon a first electric conductor made of a conductive film constituting an inductor and a first electrode made of a conductive film constituting a first portion of a capacitor; and
    the second insulating layer has thereon a second electrode made of a conductive film constituting a second portion of the capacitor; wherein
    the first and second insulating layers are stacked such that the first and second electrodes are opposed to each other through the insulating layers.

2. A multilayered circuit board according to claim 1, wherein:
    the first electric conductor is arranged along an outer periphery of the first insulating layer; and
    the first electrode is arranged inside the first electric conductor and in a center of the first insulating layer.

3. A multilayered circuit board according to claim 2, wherein the first electric conductor and the first electrode are connected to each other with a first connecting conductor made of a conductive film.

4. A multilayered circuit board according to claim 2, further comprising at least one third insulating layer stacked on the first and second insulating layers, wherein:
    the third insulating layer has a third electric conductor formed of a conductive film constituting a first inductor;
    the second insulating layer comprises:
        a second electric conductor formed of a conductive film constituting a second inductor along an outer periphery; and
        the second electrode is arranged inside the second electric conductor and in a center of the second insulating layer; and wherein the first electric conductor has a first extension and the first electrode has a second extension; and
    the inductors and the capacitor are connected in series between the first and second extensions.

5. A multilayered circuit board according to claim 3, wherein:
    the second insulating layer comprises:
        a second electric conductor formed of a conductive film constituting a second inductor along an outer periphery; and
        the second electrode formed inside the second electric conductor and in a center of the second insulating layer; wherein
    the second electric conductor has a first extension and the second electrode has a second extension; and
    the inductors and the capacitor are connected in series between the first and second extensions.

6. A multilayered circuit board according to claim 3, wherein:
    the first electric conductor has a first extension; and
    the second electrode has a second extension; wherein
    the first inductor and the capacitor are connected in series between the first and second extensions.

7. A multilayered circuit board according to claim 3, wherein:
    the second insulating layer comprises:
        a second electric conductor formed of a conductive film constituting an inductor along an outer periphery; and
        the second electrode arranged inside the second electric conductor and in a center of the second insulating layer; wherein
    the second electric conductor and the second electrode are connected to each other with a second connecting conductor formed of a conductive film;
    the first connecting conductor has a first extension and the second connecting conductor has a second extension; and
    the inductor and the capacitor are connected in parallel between the first and second extensions.

8. A multilayered circuit board according to claim 3, further comprising at least one third insulating layer stacked on the first and second insulating layers, wherein:
    the third insulating layer has a third electric conductor formed of a conductive film constituting a first inductor;
    the second insulating layer comprises:
        a second electric conductor formed of a conductive film constituting a second inductor along an outer periphery; and
        the second electrode arranged inside the second electric conductor and in a center of the second insulating layer; wherein
    the second electric conductor and the second electrode are connected to each other with a second connecting conductor formed of a conductive film;
    the first connecting conductor has a first extension and the third electric conductor has a second extension; and
    the inductors and the capacitor are connected in parallel between the first and second extensions.

* * * * *